United States Patent
Ji et al.

(10) Patent No.: US 6,909,297 B2
(45) Date of Patent: Jun. 21, 2005

(54) PROBE CARD

(75) Inventors: Joon-Su Ji, Suwon (KR); In-Seok Hwang, Hwaseong-gun (KR); Doo-Seon Lee, Hwaseong-gun (KR); Byoung-Joo Kim, Hwaseong-gun (KR); Young-Kyo Ro, Mungyeong (KR); Ho-Yeol Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/754,500

(22) Filed: Jan. 12, 2004

(65) Prior Publication Data

US 2004/0140824 A1 Jul. 22, 2004

(30) Foreign Application Priority Data

Jan. 18, 2003 (KR) .................................. 10-2003-0003514

(51) Int. Cl.[7] .............................................. G01R 31/02
(52) U.S. Cl. ...................... 324/754; 324/765; 324/158.1
(58) Field of Search .................................. 324/754–758, 324/765, 158.1; 174/261–266; 439/482, 824

(56) References Cited

U.S. PATENT DOCUMENTS

| 5,162,728 | A  | * | 11/1992 | Huppenthal ................. 324/758 |
| 6,215,320 | B1 | * | 4/2001  | Parrish ...................... 324/754 |
| 6,292,006 | B1 | * | 9/2001  | Fredrickson ................ 324/754 |
| 6,667,631 | B2 | * | 12/2003 | Ivanov ....................... 324/762 |
| 6,720,501 | B1 | * | 4/2004  | Henson ...................... 174/262 |

* cited by examiner

*Primary Examiner*—Minh N. Tang
(74) *Attorney, Agent, or Firm*—Volentine Francos & Whitt PLLC

(57) ABSTRACT

A probe card is provided which includes a plurality of stacked signal printed circuit boards for transmitting signals, and a plurality of ground printed circuit boards respectively interposed between the signal printed circuit boards. To reduce ground noise, each of the ground printed circuit boards includes a plurality of conductive ground regions which are insulated from each other.

13 Claims, 4 Drawing Sheets

PROBE CARD

BACKGROUND OF THE INVENTION

1. Field of the Invention

The present invention relates to a probe card, and more particularly, the present invention relates to a probe card used to test electrical characteristics of chips on a semiconductor wafer.

A claim of priority under 35 U.S.C. § 119 it made to Korean Patent Application 2003-3514 filed on Jan. 18, 2003, the entire contents of which are hereby incorporated by reference.

2. Description of the Related Art

A semiconductor test apparatus, which is used to test electrical characteristics of chips manufactured on a wafer, typically includes a tester, a performance board, a probe card, a chuck, and a prober.

The probe card of the semiconductor test apparatus is made up of a stack of alternately arranged signal printed circuit boards and ground printed circuit boards. The signal printed circuit boards are for applying power supply signals, command and address signals, and data signals, and the ground printed circuit boards are for applying ground signals.

Rather than individually testing chips one at a time, the conventional semiconductor test apparatus is capable of testing a plurality of chips at the same time. However, as explained below, the conventional probe card suffers from ground noise which can result in erroneous test results.

FIG. 1 is a block diagram illustrating a conventional semiconductor test apparatus. The semiconductor test apparatus of FIG. 1 includes a tester 10, a performance board 12, a probe card 14, a chuck 20, and a prober 22. The performance board 12 includes an upper board 12-1 and a lower board 12-2.

In FIG. 1, reference numeral 16 denotes a probe needle which is fixed to the probe card 14, and reference numeral 18 denotes a wafer 18 loaded onto the chuck 20.

The functioning of the components of the semiconductor test apparatus of FIG. 1 are explained below.

The tester 10 outputs a test signal and determines whether or not the chips of the wafer 18 are operating normally based on a received signal corresponding to the output test signal. The performance board 12 transmits the signal output from the tester 10 to the probe card 14, and transmits a signal received from the probe card 14 to the tester 10. The probe card 14 transmits a signal received from the performance board 12 to pads of the wafer 18 through the needle 16, and transmits a signal outputted from the pads of the wafer 18 through the needle 16 to the performance board 12. The chuck 20 is attached to the prober 22 and is used to mount the wafer 18. The prober 22 moves the chuck 20 to a desired location under control of the tester 10.

As shown in FIG. 1, the tester 10 generates power supply signals P1 and P2, a power ground signal PG, command and address signals C1 to Cm, ground signals CG1 to CGm of the respective command and address signals C1 to Cm, data input/output signals IO1 to IOn, and ground signals G1 to Gm of the respective data input/output signals IO1 to IOn. The signals generated from the tester 10 are applied to the upper board 12-1 of the performance board 12 through signal lines PSL1, CSL1 and IOSL1, and signals outputted from the upper board 12-1 of the performance board 12 are transmitted to the lower board 12-2 through signal lines PSL2, CSL2 and IOSL2. The signals outputted through the lower board 12-2 of the performance board 12 are transmitted to the probe card 14 through signal lines PSL3, CSL3 and IOSL3. That is, each of the signals outputted from the tester 10 is transmitted to the probe card 14. Of course, the ground signals CG1 to CGm among the signals outputted from the tester 10 can be simultaneously transmitted through a single line, and the ground signals G1 to Gm can be simultaneously transmitted through a single line.

FIG. 2 is a cross-sectional schematic view of the probe card of the semiconductor test apparatus of FIG. 1. The probe card of FIG. 2 includes a plurality of stacked printed circuit boards 30, 32 and 34.

In FIG. 2, reference numeral 30 denotes printed circuit boards for applying power supply signals P1 and P2 and the ground signal PG. Reference numeral 32 denotes printed circuit boards for applying the command and address signals C1 to Cm and the ground signals CG1 to CGm. Reference numeral 34 denotes printed circuit boards for applying the data input/output signals IO1 to IOn and the ground signals G1 to Gn. The printed circuit boards are electrically insulated from each other.

FIG. 3 shows one of the ground printed circuit boards of the probe card of FIG. 2.

In FIG. 3, the symbol "o" denote signal through holes, and reference numeral 40 denotes a conductive area. Among the through holes "o", holes to which the ground signals PG, CG1 to CGm and G1 to Gm are applied are electrically connected to the conductive area 40 of the ground printed circuit board, and holes to which the power supply signals P1 and P2, the command and address signals C1 to Cm, and the data input/output signals IO1 to IOn are applied are electrically insulated from the conductive area 40 of the ground printed circuit board.

As such, while the ground signals PG, CG1 to CGm and G1 to Gm are individually applied to the probe card 14, these ground signals are commonly connected within the probe card 14 prior to be being applied to chips DUT1 to DUT4, regions of which are shown by dotted lines in FIG. 3. As a result, the ground signals PG, CG1 to CGm and G1 to Gn applied to ground pads (not shown) of the chips DUT1 to DUT4 are electrically connected in the probe card.

The common electrical connection of ground signals PG, CG1 to CGm and G1 to Gn within the probe card of the conventional test apparatus can cause problems when the ground signals are applied to the ground pads of the chips of the wafer 18. More specifically, when multiple chips are simultaneously tested at a high operating speed, the multiple test signals thereof having the common ground can create ground noise in the probe card. This ground noise can in turn result in normally operative chips being incorrectly tested as defective chips.

SUMMARY OF THE INVENTION

It is an object of the present invention to provide a probe card which exhibits a reduction in ground noise.

According to a first aspect of the invention, a probe card is provided which includes a plurality of stacked signal printed circuit boards for transmitting signals, and a plurality of ground printed circuit boards respectively interposed between the signal printed circuit boards. Each of the ground printed circuit boards includes a plurality of conductive ground regions which are insulated from each other.

According to another aspect of the present invention, a a probe card is provided for use in simultaneously testing a given number of semiconductor chips. The probe card includes a plurality of stacked signal printed circuit boards for transmitting signals, and a plurality of ground printed circuit boards respectively interposed between the signal printed circuit boards. Each of the ground printed circuit boards includes a number of conductive ground regions which are insulated from one another, where the number of conductive ground regions is at least equal to twice the given number semiconductor chips.

According to still another aspect of the present invention, a probe card is provided for use in simultaneously testing a given number of sets of semiconductor chips, where each set includes at least two semiconductor chips. The probe card includes a plurality of stacked signal printed circuit boards for transmitting signals, and a plurality of ground printed circuit boards respectively interposed between the signal printed circuit boards. Each of the ground printed circuit boards includes a number of conductive ground regions which are insulated from one another, where the number of conductive ground regions is at least equal to twice the given number of sets of semiconductor chips.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, an example of which is illustrated in the accompanying drawings.

Figure 1:
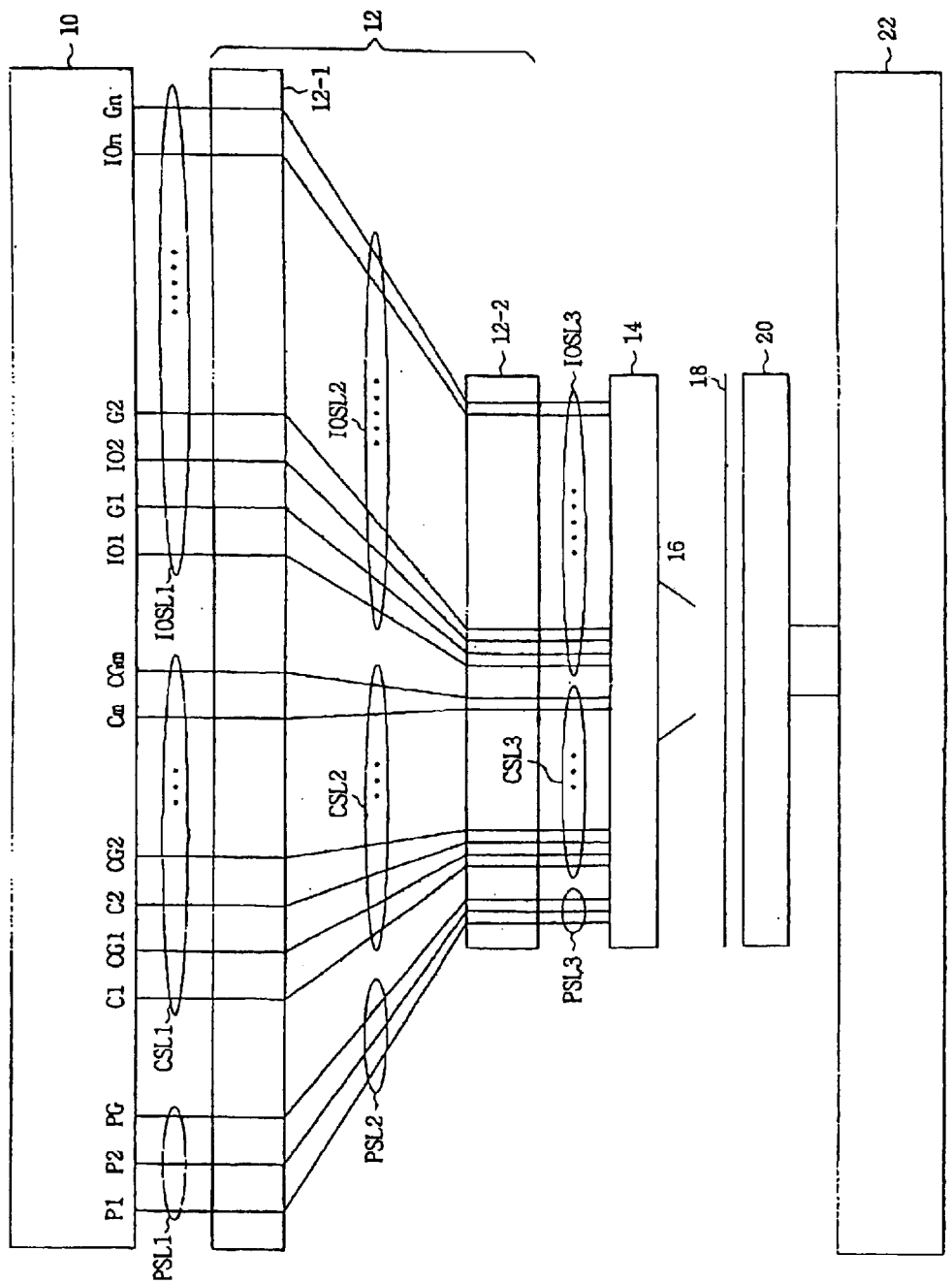
FIG. 1 is a block diagram illustrating a conventional semiconductor test apparatus.
Figure 2:
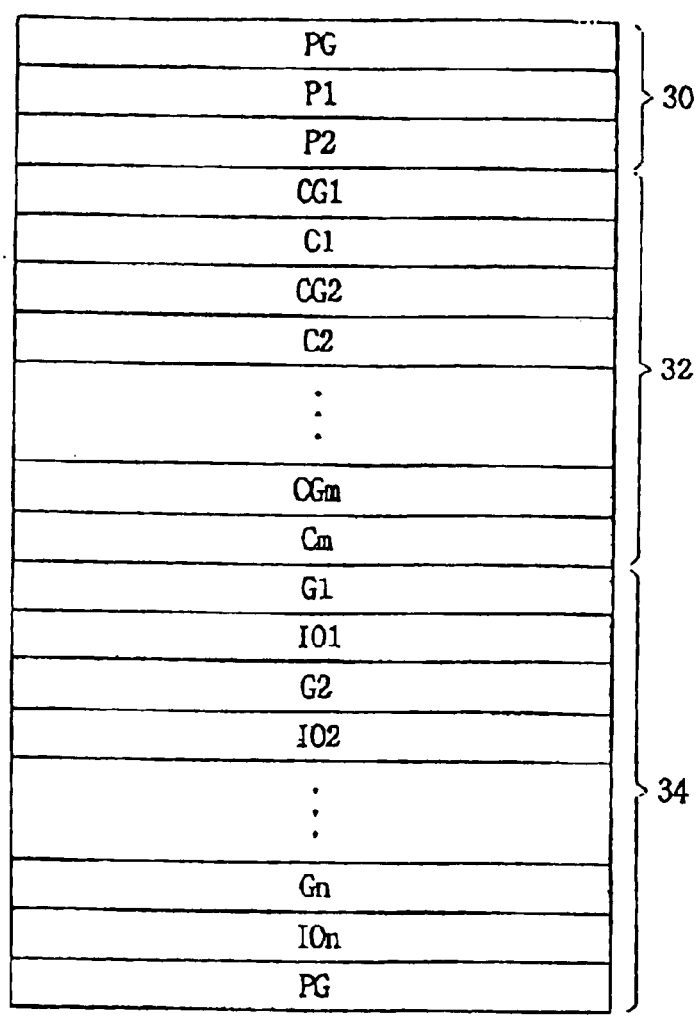
FIG. 2 is a cross-sectional view illustrating a probe card of the semiconductor test apparatus of FIG. 1.
Figure 3:
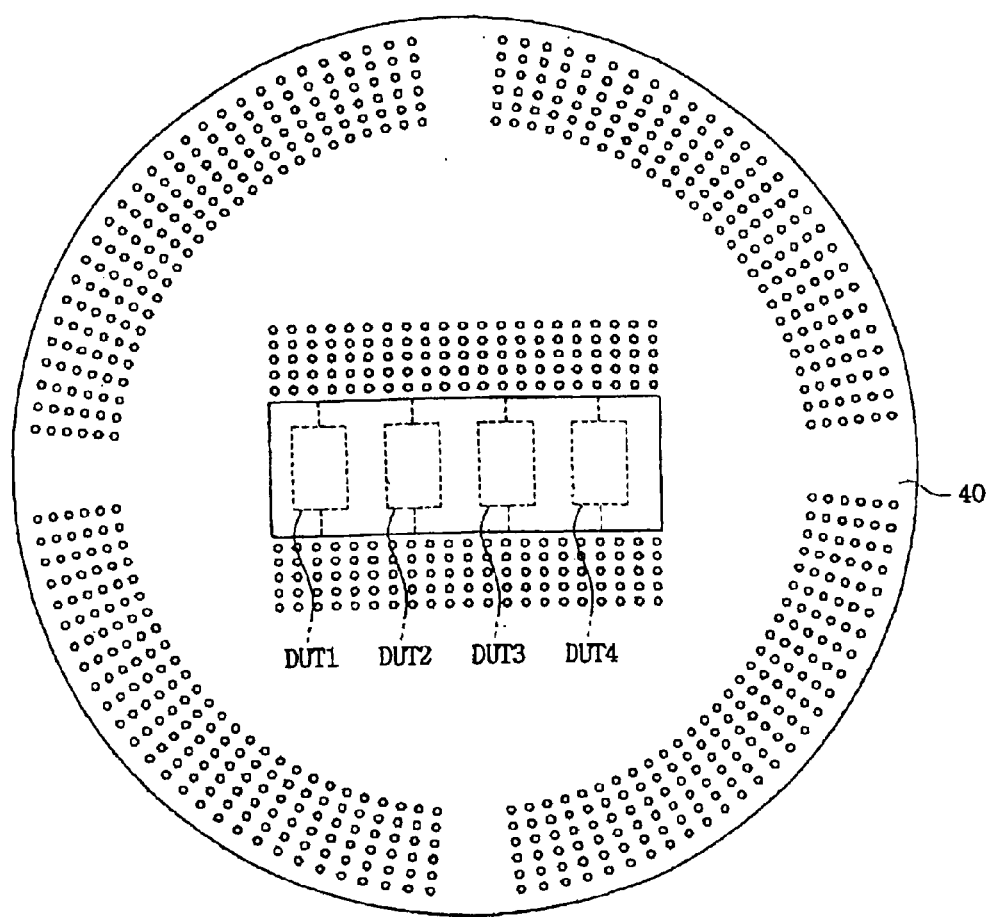
FIG. 3 shows a ground printed circuit board of the probe card of FIG. 2.
Figure 4:
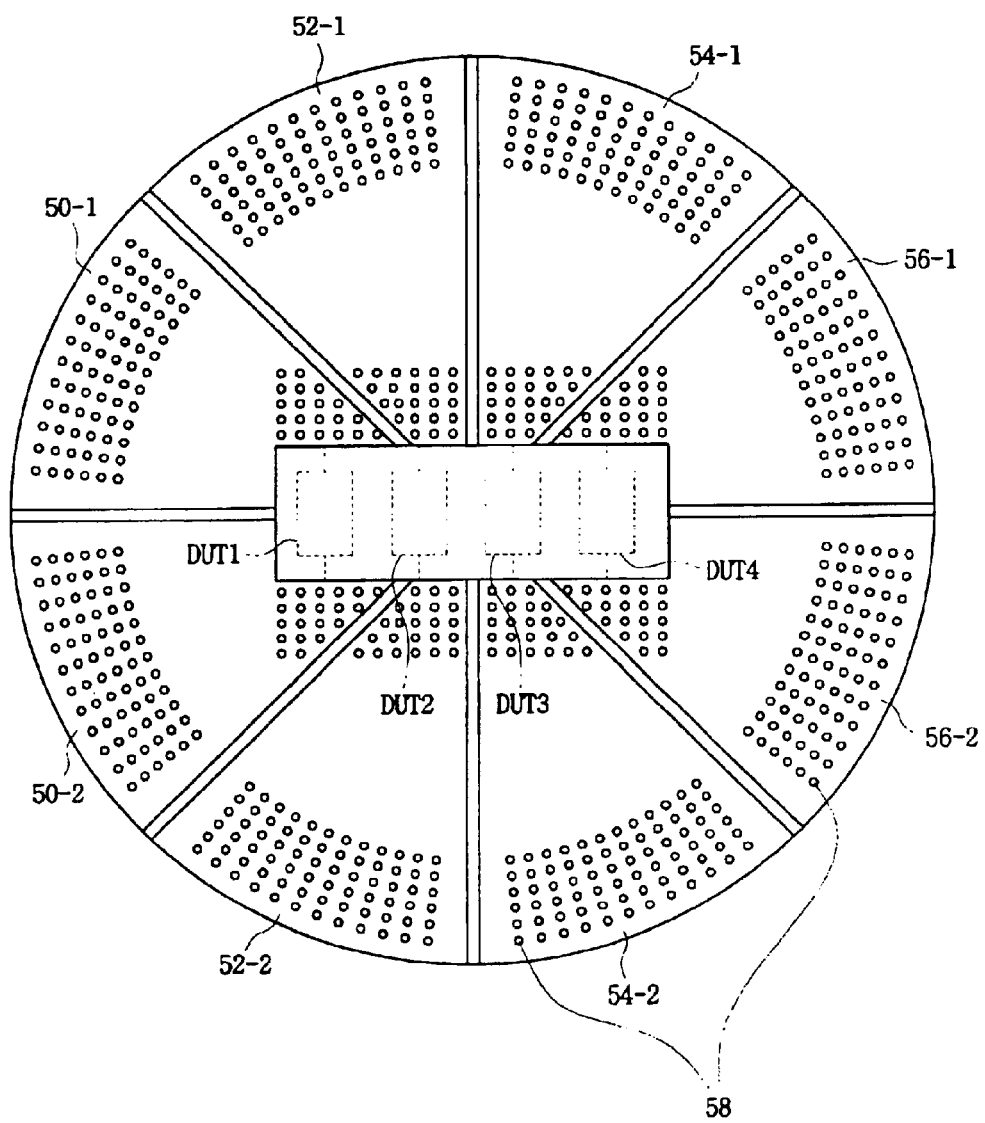
FIG. 4 shows a ground printed circuit board of a probe card according to the present invention.

FIG. 4 shows a ground printed circuit board of a probe card according to an embodiment of the present invention. The probe card of this embodiment is configured as illustrated in FIGS. 1 and 2, except that it includes ground printed circuit board of FIG. 4 rather than that of FIG. 3. The dashed lines of FIG. 4 denote regions of chips DUT1, DUT2, DUT3 and DUT4 being tested.

In FIG. 4, the symbol "o" denotes signal application holes, reference numerals 50-1, 52-1, 54-1, and 56-1 denote conductive regions containing holes for applying the ground signals PG, CG1 to CGm of the respective chips DUT1 to DUT4, and reference numerals 50-2, 52-2, 54-2, and 56-2 denote conductive regions containing holes for applying the ground signals G1 to Gn of the respective chips DUT1 to DUT4. Also, the holes "o" include application holes for applying the power supply signals P1 and P2, the command address signals C1 to Cm and the data input/output signals IO1 to IOn. The holes to which the ground signals PG, CG1 to CGm and G1 to Gn are applied for each of the chips DUT1 through DUT4 are electrically connected to a respective conductive region of the ground printed circuit board, and the holes to which the powers P1 and P2, the command and address signals C1 to Cm and the data input/output signals IO1 to IOn are applied are electrically insulated from the ground printed circuit board.

The probe card 14 of the present embodiment thus segregates the ground signals PG and CG1 to CGm from the ground signals G1 to Gm in the ground printed circuit board for each of the chips DUT1 to DUT4, respectively. As such, ground noise in the probe card is substantially reduced.

In another embodiment of the invention, the ground signals PG are further segregated from the ground signals CG1 to CGm, whereby three conductive ground regions are provided for each of the chips being tested. In this case, each of the ground printed circuit boards include plural first conductive ground regions for the ground signals PG applied to the respective semiconductor chips, plural second conductive ground regions for the ground signals CG1 and CGm applied to the respective semiconductor chips, and plural third conductive ground regions for the ground signals G1 to Gm applied to the respective semiconductor chips. Thus, in the case where there are four chips DUT1 to DUT4 to be tested, each ground printed circuit board would be segregated into twelve conductive ground regions.

Also, in another embodiment, the probe board is configured such that each conductive ground region is used for a set of two or more semiconductor chips being tested. For example, in the case where 32 chips are to be simultaneously tested, the 32 chips can be divided into 16 sets of 2 chips each. Each segregated conductive ground region of the ground printed circuit board applies signals to each set of semiconductor chips. Thus, the ground printed circuit board would have 32 conductive ground regions (i.e., 2 regions for each set of chips) in the case where ground signals PG and CG1 to CGm are segregated the ground signals G1 to Gm, and the ground printed circuit board would have 48 conductive ground regions (i.e., 3 regions for each set of chips) in the case where the ground signals. PG are further segregated from the ground signals G1 to Gm.

By segregating the ground signals within the probe card as described above, ground noise within the probed card is substantially reduced. Accordingly, the accuracy of the testing is improved, which in turn results in a better device yield.

In the above described probe card, the conductive ground regions are illustrated as being segregated in a radial direction. It is noted, however, that the conductive ground regions may be arranged in a different configuration.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A probe card, comprising:
   a plurality of stacked signal printed circuit boards for transmitting signals; and
   a plurality of ground printed circuit boards respectively interposed between the signal printed circuit boards,
   wherein each of the ground printed circuit boards includes a plurality of conductive ground regions which are insulated from each other.

2. A probe card for use in simultaneously testing a given number of semiconductor chips, said probe card comprising:
   a plurality of stacked signal printed circuit boards for transmitting signals; and
   a plurality of ground printed circuit boards respectively interposed between the signal printed circuit boards, wherein each of the ground printed circuit boards includes a number of conductive ground regions which are insulated from one another, and wherein the number of conductive ground regions is at least equal to twice the given number semiconductor chips.

3. The probe card of claim 2, wherein each of the ground printed circuit boards includes the given number of first conductive ground regions for first ground signals applied to the respective semiconductor chips, and the given number of second conductive ground regions for second ground signals applied to the respective semiconductor chips.

4. The probe card of claim 3, wherein the first ground signals include power supply ground signals, command ground signals and address ground signals, and wherein the second ground signals include data input/output ground signals.

5. The probe card of claim 2, wherein the number of conductive ground regions of each ground printed circuit board is at least equal to three times the given number of semiconductor chips.

6. The probe card of claim 5, wherein each of the ground printed circuit boards includes the given number of first conductive ground regions for first ground signals applied to the respective semiconductor chips, the given number of second conductive ground regions for second ground signals applied to the respective semiconductor chips, and the given number of third conductive ground regions for third ground signals applied to the respective semiconductor chips.

7. The probe card of claim 6, wherein the first ground signals include power supply ground signals, wherein the second ground signals include command signals and address signals, and wherein the third ground signals include data input/output ground signals.

8. A probe card for use in simultaneously testing a given number of sets of semiconductor chips, each set including at least two semiconductor chips, said probe card comprising:
a plurality of stacked signal printed circuit boards for transmitting signals; and
a plurality of ground printed circuit boards respectively interposed between the signal printed circuit boards,
wherein each of the ground printed circuit boards includes a number of conductive ground regions which are insulated from one another, and wherein the number of conductive ground regions is at least equal to twice the given number of sets of semiconductor chips.

9. The probe card of claim 8, wherein each of the ground printed circuit boards includes the given number of first conductive ground regions for first ground signals applied to the respective sets of semiconductor chips, and the given number of second conductive ground regions for second ground signals applied to the respective sets of semiconductor chips.

10. The probe card of claim 9, wherein the first ground signals include power supply ground signals, command ground signals and address ground signals, and wherein the second ground signals include data input/output ground signals.

11. The probe card of claim 8, wherein the number of conductive ground regions of each ground printed circuit board is at least equal to three times the given number of sets of semiconductor chips.

12. The probe card of claim 11, wherein each of the ground printed circuit boards includes the given number of first conductive ground regions for first ground signals applied to the respective sets of semiconductor chips, the given number of second conductive ground regions for second ground signals applied to the respective sets of semiconductor chips, and the given number of third conductive ground regions for third ground signals applied to the respective sets of semiconductor chips.

13. The probe card of claim 12, wherein the first ground signals include power supply ground signals, wherein the second ground signals include command signals and address signals, and wherein the third ground signals include data input/output ground signals.

* * * * *